US 9,267,998 B2

(12) United States Patent
Gaul et al.

(10) Patent No.: US 9,267,998 B2
(45) Date of Patent: Feb. 23, 2016

(54) PROTECTIVE CIRCUIT FOR A RECHARGEABLE BATTERY PACK

(71) Applicant: Andreas Stihl AG & Co. KG, Waiblingen (DE)

(72) Inventors: Henrik Gaul, Schorndorf (DE); Martin Schurr, Mutlangen (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 389 days.

(21) Appl. No.: 13/726,366

(22) Filed: Dec. 24, 2012

(65) Prior Publication Data
US 2013/0162052 A1 Jun. 27, 2013

(30) Foreign Application Priority Data

Dec. 22, 2011 (DE) .......................... 10 2011 121 934

(51) Int. Cl.
*H01H 31/10* (2006.01)
*G01R 31/36* (2006.01)
*H01H 47/00* (2006.01)
*G01R 31/40* (2014.01)
*H01M 10/44* (2006.01)
(Continued)

(52) U.S. Cl.
CPC ............ *G01R 31/3627* (2013.01); *G01R 31/40* (2013.01); *H01H 47/002* (2013.01); *H01M 10/441* (2013.01); *G01R 19/16542* (2013.01); *G01R 31/3658* (2013.01); *H01M 2/202* (2013.01); *H01M 10/425* (2013.01); *H01M 10/482* (2013.01); *H01M 2010/4271* (2013.01); *H02H 7/18* (2013.01); *H02J 7/0026* (2013.01); *H02J 2007/0039* (2013.01); *Y10T 307/76* (2015.04)

(58) Field of Classification Search
USPC .................................................. 307/115–116
See application file for complete search history.

(56) References Cited

U.S. PATENT DOCUMENTS 5,818,201 A 10/1998 Stockstad et al.
6,331,764 B1 12/2001 Oglesbee et al.
(Continued)

FOREIGN PATENT DOCUMENTS

CN 102263217 A 11/2011
EP 1 769 699 A1 4/2007
(Continued)

OTHER PUBLICATIONS

European Search Report of the European Patent Office dated Mar. 8, 2013 in the corresponding European patent application EP12008362.
(Continued)

*Primary Examiner* — Danny Nguyen
(74) *Attorney, Agent, or Firm* — Walter Ottesen P.A.

(57) ABSTRACT

A protective circuit for an arrangement which includes a plurality of individual cells in a rechargeable battery pack with a predefined number of individual cells being connected in series in a cell row and at least two cell rows being situated parallel to one another. The component current flowing in a first cell row when the rechargeable battery pack is subject to loading is compared with the component current flowing in a second cell row to generate a signal when there is an implausible deviation in the component currents with respect to one smother. The signal is used to disconnect a defective cell row or to switch off the entire rechargeable battery pack in order to protect the latter.

24 Claims, 4 Drawing Sheets

(51) Int. Cl.
*H02J 7/00* (2006.01)
*H02H 7/18* (2006.01)
*G01R 19/165* (2006.01)
*H01M 2/20* (2006.01)
*H01M 10/42* (2006.01)
*H01M 10/48* (2006.01)

(56) References Cited

U.S. PATENT DOCUMENTS

| | | | |
|---|---|---|---|
| 6,627,345 B1 | 9/2003 | Zemlok et al. | |
| 6,841,291 B2 | 1/2005 | Minamiura | |
| 7,073,614 B2 | 7/2006 | Saito et al. | |
| 7,498,774 B2 | 3/2009 | Ziegler et al. | |
| 7,553,583 B2 | 6/2009 | Eaves | |
| 7,592,773 B2 | 9/2009 | Pellenc | |
| 8,410,756 B2 | 4/2013 | Sakakibara et al. | |
| 8,691,412 B2 | 4/2014 | Yonishi | |
| 2003/0087147 A1* | 5/2003 | Minamiura | 429/61 |
| 2004/0138785 A1* | 7/2004 | Emori et al. | 700/286 |
| 2005/0057221 A1 | 3/2005 | Desilvestro et al. | |
| 2005/0161305 A1 | 7/2005 | Jenni et al. | |
| 2006/0196215 A1 | 9/2006 | Crumlin et al. | |
| 2008/0050645 A1 | 2/2008 | Kai et al. | |
| 2010/0123434 A1 | 5/2010 | Iwata | |
| 2010/0181966 A1 | 7/2010 | Sakakibara | |
| 2010/0221590 A1 | 9/2010 | Reber | |
| 2010/0221591 A1 | 9/2010 | Rosskamp et al. | |
| 2010/0321025 A1 | 12/2010 | Lin et al. | |
| 2011/0003182 A1 | 1/2011 | Zhu | |
| 2011/0068744 A1 | 3/2011 | Zhu | |
| 2011/0074354 A1 | 3/2011 | Yano | |
| 2011/0097619 A1 | 4/2011 | Park | |
| 2011/0248675 A1 | 10/2011 | Shiu et al. | |
| 2011/0287287 A1 | 11/2011 | Kang | |
| 2013/0162055 A1 | 6/2013 | Reber et al. | |
| 2013/0162217 A1 | 6/2013 | Gaul et al. | |
| 2013/0163135 A1 | 6/2013 | Liebhard et al. | |
| 2013/0164600 A1 | 6/2013 | Rosskamp et al. | |

FOREIGN PATENT DOCUMENTS

| | | |
|---|---|---|
| FR | 2958083 A1 | 9/2011 |
| GB | 2 383 765 A | 7/2003 |
| GB | 2 409 832 A | 7/2005 |
| WO | 98/48470 A1 | 10/1998 |
| WO | WO 02/30631 A2 | 4/2002 |

OTHER PUBLICATIONS

Partial English translation and Chinese Search Report of the Chinese Patent Office dated Jun. 17, 2015 in the corresponding Chinese patent application CN20120560002.7.

* cited by examiner

PROTECTIVE CIRCUIT FOR A RECHARGEABLE BATTERY PACK

CROSS REFERENCE TO RELATED APPLICATION

This application claims priority of German patent application no. 10 2011 121 934.3, filed Dec. 22, 2011, the entire content of which is incorporated herein by reference.

FIELD OF THE INVENTION

The invention relates to a protective circuit for an arrangement which includes a plurality of individual cells in a rechargeable battery pack, with a predefined number of individual cells being connected in series in a cell row.

BACKGROUND OF THE INVENTION

Rechargeable battery pack arrangements of this kind which include, for example, chemically lithium-based cells are used in handheld work apparatus and are intended to ensure a long service duration of the work apparatus, which is supplied with energy via the rechargeable battery pack, at a high power.

A large composite cell is only as good as its weakest cell; if an individual cell ages more quickly than another, the cell row containing the weaker cell is adversely affected as a whole, in particular, compensation currents can also flow within the rechargeable battery pack and restrict the performance of the rechargeable battery pack. If an individual cell is defective, compensation currents can also flow within the rechargeable battery pack when no external load is applied to the rechargeable battery pack. The individual cells in good condition have a higher degree of self-discharge as a result.

SUMMARY OF THE INVENTION

It is an object of the invention to configure a protective circuit for an arrangement which includes a plurality of individual cells in a rechargeable battery pack in such a manner that the malfunctioning of one individual cell in the entire cell arrangement can be identified in a quick and reliable manner without complicated measurements.

The protective circuit of the invention is for an arrangement having a plurality of individual ceils in a rechargeable battery pack, wherein a predetermined number of individual ceils are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack. The protective circuit includes: a circuit device configured to compare the first component current with the second component currant to determine whether an implausible deviation is present therebetween and generate a signal when an implausible deviation is present.

If at least two cell rows are situated parallel to one another, a load current of the rechargeable battery pack is divided into component currents of the cell rows. If the cell rows are identical, the load current is uniformly divided. In accordance with the invention, when the rechargeable battery pack is subject to loading, the component current flowing in a first cell row at a time point is compared with the component current flowing in a second cell row at the same time point; a signal is generated if there is an implausible deviation in the component currents.

In the case of a comparison of this kind for implausible deviations, the measurement signals themselves do not have to be evaluated, for example by using algorithms, but rather, for example, simple comparison of the component currents, which are detected at the same time point, from the parallel cell rows is sufficient. If the component currents of different cell rows deviate from one another to a considerable extent, that is, are different, there must be a fault in one of the cell rows since only identical current values are plausible on account of the identical structural design of the cell rows. The signal is generated in the case of an implausible deviation, the signal reflecting the deviation in the rechargeable battery pack from the normal operating state and it being possible, for example, to use the signal to switch off the rechargeable battery pack.

A signal is generated in a simple manner when a difference in the component currents exceeds a predefined limit value; the difference from the previously standardized component currents is advantageously calculated. If a difference signal is formed between the component currents flowing at the same time point, this difference signal then being compared with a predefined limit value, an implausible deviation can be identified. In the case of identical cell rows, the limit value is predefined at "zero"; if the difference single deviates significantly from the limit value, the component currents are no longer plausible, and a signal is generated.

It can be advantageous to take into consideration the ratio of the component currents at a time point t; it is also possible to draw conclusions about the plausibility of the component currents directly from the ratio. A permissible, plausible ratio is, for example, "one", provided that the component currents flowing at the same time point are compared in cell rows with the same construction. If the calculated ratio deviates significantly from the expected ratio "one", the component currents are no longer plausible, and a signal is generated.

A plausibility comparison is also possible in a simple manner by the mathematical sign of the component currents being monitored for a change in mathematical sign in relation to one another. It may also be sufficient to derive the implausible deviation from a change in the mathematical sign of the same component current. This can be done, for example, by calculating the ratio of the component current in a first cell row at a first time point to the component current of the same first cell row at a second time point.

Since no absolute values are required for the plausibility comparison, relative values, which are easy to process, are calculated by standardizing the detected component currents with respect to the number of individual cells which are situated in parallel in a cell row.

A further possible manner of making a plausibility comparison is possible by the sum of all the component currents at a time point being compared with the total current of the rechargeable battery pack at the same time point. A sum current is expediently formed from the magnitudes of the component currents and compared with the total current; if the sum current and the total current deviate from one another, the component currents are no longer plausible, and a corresponding signal is generated.

In a particular development of the invention, a maximum component current is established from ail the component currents, in particular the standardized component currents, detected at one time point and used for further evaluation. To this end, a difference current between the maximum component current and each of the other component currents is determined in each case and the determined difference currents are compared with a limit value. If the limit value is exceeded, a signal is generated.

The component currents or measurement values which correspond to the component currents are advantageously supplied to an evaluation unit in which the plausibility is examined and which emits an output signal in the case of an implausible deviation.

The signal which is generated by the evaluation unit can be used as a control signal which actuates a switch. A controlled switch is expediently provided in each cell row of the rechargeable battery pack, and therefore a component can be disconnected separately from the others and the voltage which is dropped across the switch in a cell row can at the same time be detected as a proportional variable to a flowing component current and can be evaluated. As a result, shunt resistors which are otherwise required for current measurement can be dispensed with.

The switches provided are advantageously electronic switches, in particular MOSFETs or similar components.

If the rechargeable battery pack is made up of more than two parallel cell rows, the component currents flowing in all the cell rows are compared with one another for plausibility.

In a development of the invention, cell connectors are provided between the individual ceils of a cell row and a cell connector which is situated at a point in a cell row between the individual ceils is electrically connected via a compensation line to the cell connector which is situated at a similar point in the parallel cell row. The potential of the cell connector which is connected to the compensation line at the one point in the one cell row is detected as the first measurement variable. The potential of the cell connector which is electrically connected to the compensation line at the same point in the parallel cell row is likewise detected as a measurement variable. The detected potentials are supplied to an evaluation unit. In particular, the detected potentials are evaluated with respect to one another, with the evaluation result permitting a prediction to be made about the defective cell at the point in the cell row. A signal is generated depending on the evaluation, it being possible to use the signal to control the switches in the rechargeable battery pack.

The detected potentials of the cell connectors which are situated at the same point in the parallel cell rows are directly compared with one another in a simple manner and a difference voltage is advantageously derived by subtraction, it being possible to use the value of the difference voltage to directly drive the switches in the rechargeable battery pack. If the difference voltage exceeds a threshold value, a signal for switching off the rechargeable battery pack is output.

The cell rows are advantageously arranged in a housing of the rechargeable battery pack, with an evaluation unit being provided in the housing, the potentials of the cell connectors, which are connected to compensation lines, of the one cell row and the detected potentials of the associated cell connectors of a parallel cell row being supplied to the evaluation unit. The evaluation unit can be designed as a microprocessor and can evaluate the respectively detected potentials using a corresponding algorithm.

A rechargeable battery block advantageously has more than two cell rows which are electrically parallel to one another. All the cell connectors which are situated at the same point in the parallel cell row are advantageously electrically connected to one another via compensation lines. The potentials of the cell connectors of the last cell row of the parallel circuit and the cell connectors of the first cell row of the parallel circuit are detected and evaluated within a parallel circuit of the above kind comprising a plurality of cell rows. The cell rows are expediently the outer cell rows of the parallel circuit.

A further, independent invention is formed by the parallel cell rows of the individual cells forming an imaginary matrix including m rows of individual ceils and n columns of cell rows. The row containing a defect can be determined by comparing the potentials of the cell connectors, and the column containing the defect can be determined by checking the plausibility of the component currents of the cell rows. It is possible to locate the defect within the arrangement which includes individual ceils in this manner. In this case, a defective cell row which is established in accordance with the matrix principle can be disconnected by the switch of the cell row in a targeted manner.

The signal which is generated by the evaluation unit can advantageously also be used as a control signal for switching off the entire rechargeable battery pack by means of one or more switches.

BRIEF DESCRIPTION OF THE DRAWINGS

The invention will now be described with reference to the drawings wherein.

DESCRIPTION OF THE PREFERRED EMBODIMENTS OF THE INVENTION

Figure 1:
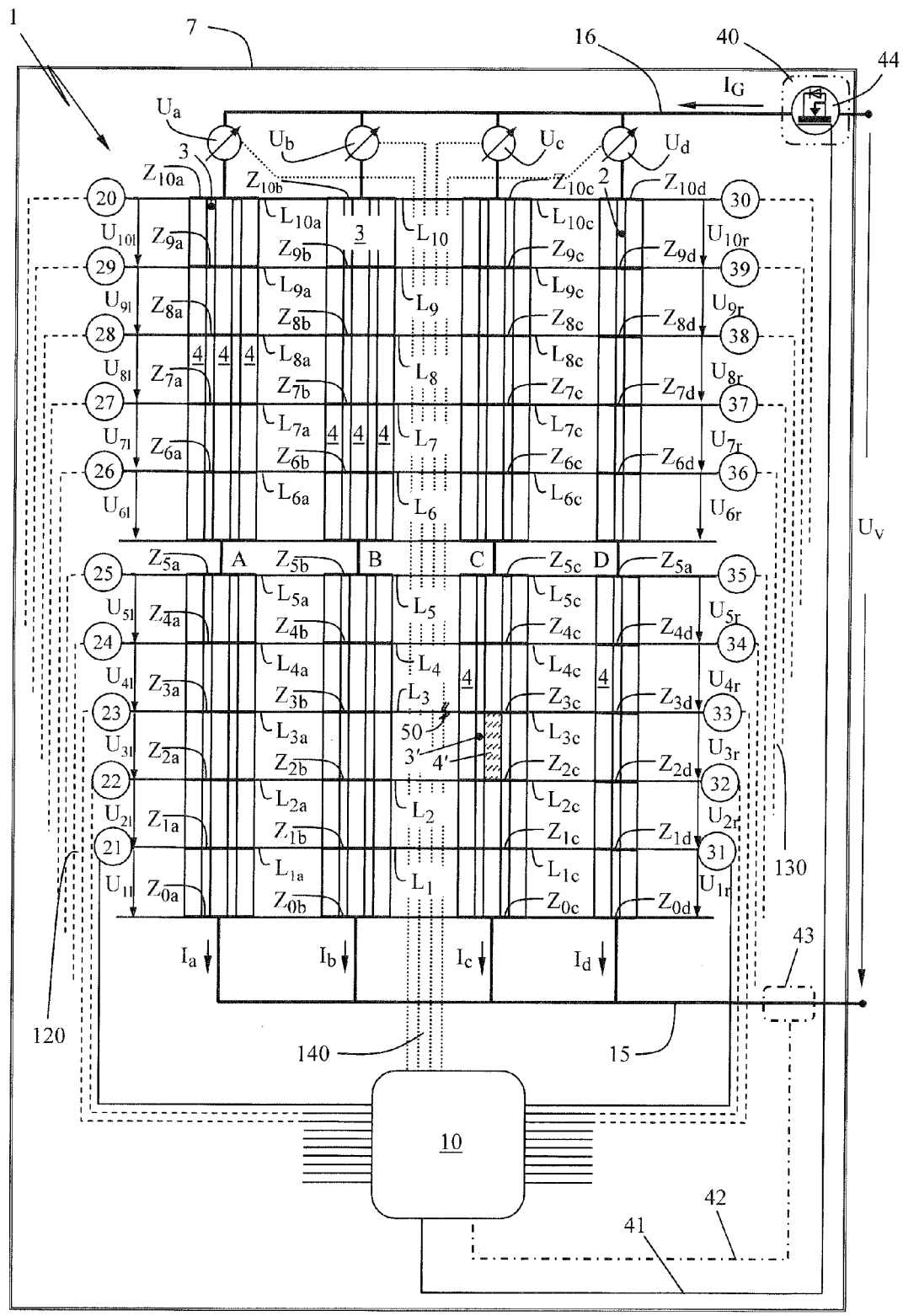
FIG. 1 shows a schematic of an electrical equivalent circuit diagram of a rechargeable battery pack.

FIG. 1 shows a rechargeable battery pack 1 which is made up of a plurality of cell blocks (2, 3). In the embodiment shown, an identical number of cell blocks (2, 3) are connected in series in order to form respective cell rows A, B, C or D. The cell rows A, B, C and D are situated parallel to one another and are connected to respective terminal poles (15, 16) of the rechargeable battery pack 1 by way of their respective ends. The external supply voltage $U_V$ is situated between the connection poles (15, 16).

In the embodiment, cell rows A, B, C and D include ten cell blocks (2, 3) which are connected in series.

Figure 2:
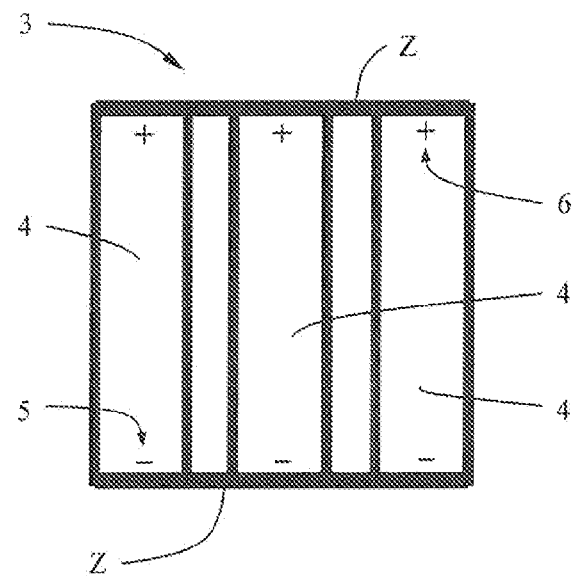
FIG. 2 shows a schematic of a cell block of the rechargeable battery pack according to FIG. 1.

FIG. 2 shows, by way of example, a call block 3. In the embodiment shown, the cell block 3 includes three individual cells 4 which are connected electrically in parallel and of which the connections are connected in each case to cell connector Z. The connectors Z form respective connection poles (5, 6) of the cell block 3.

As shown in FIG. 1, the cell blocks 2 are formed from two individual cells 4 which are connected in parallel; a cell block can also be formed from just one single individual cell 4. A cell block (2, 3) expediently includes a plurality of individual cells which are connected electrically in parallel and/or in series.

The rechargeable battery pack 1, which includes four parallel cell rows A, B, C, D in the embodiment, is provided with a plurality of compensation lines which are designated $L_{na}$, $L_{nb}$, $L_{nc}$ in general, where n can assume the number "0" to "10" ($0 \leq n \leq 10$). The compensation lines $L_{na}$, $L_{nb}$, $L_{nc}$ are provided as electrical transverse links between the cell rows A, B, C and D. The compensation lines $L_{na}$, $L_{nb}$, $L_{nc}$ are not absolutely necessarily required solely for the plausibility check.

Cell connectors are situated between the individual cells 4 or cell blocks (2, 3) of respective rows (A, B, C, D). As shown in FIG. 1, the cell row A has the cell connectors ($Z_{0a}$, $Z_{1a}$, $Z_{2a}$, $Z_{3a}$, $Z_{4a}$, $Z_{5a}$, $Z_{6a}$, $Z_{7a}$, $Z_{8a}$, $Z_{9a}$, $Z_{10a}$) which are also referred to as cell connectors $Z_{na}$ (0≤n≤10) below. Accordingly, cell row B has cell connectors $Z_{nb}$, that is, the cell connectors ($Z_{0b}$, $Z_{1b}$, $Z_{2b}$, $Z_{3b}$, $Z_{4b}$, $Z_{5b}$, $Z_{6b}$, $Z_{7b}$, $Z_{8b}$, $Z_{9b}$, $Z_{10b}$) between the cell blocks 3, the cell connectors being designated $Z_{nb}$ (0≤n≤10) in general. The cell connectors between the cell blocks 3 of the cell row C are designated $Z_{nc}$, that is, $Z_{0c}$, $Z_{1c}$, $Z_{2c}$, $Z_{3c}$, $Z_{4c}$, $Z_{5c}$, $Z_{6c}$, $Z_{7c}$, $Z_{8c}$, $Z_{9c}$, $Z_{10c}$, and are generally called $Z_{nc}$ (0≤n≤10). The cell connectors of the cell row D are designated by reference symbol $Z_{nd}$ (0≤n≤10), that is, $Z_{0d}$, $Z_{1d}$, $Z_{2d}$, $Z_{3d}$, $Z_{4d}$, $Z_{5d}$, $Z_{6d}$, $Z_{7d}$, $Z_{8d}$, $Z_{9d}$, $Z_{10d}$.

The cell connector $Z_{1a}$ is situated in the cell row A at the same first point as the cell connector $Z_{1b}$ in the cell row B, the cell connector $Z_{1c}$ in the cell row C and the cell connector $Z_{1d}$ in the cell row D. Therefore, each cell connector $Z_{na}$ of the cell row A is situated at the same n-th point as the cell connector $Z_{nb}$ in the cell row B, the cell connector $Z_{nc}$ in the cell row C or the cell connector $Z_{nd}$ in the cell row D.

The compensation lines $L_{na}$, $L_{nb}$ and $L_{nc}$ each connect the cell connectors $Z_{na}$, $Z_{nb}$, $Z_{nc}$ and $Z_{nd}$, which are situated at the same n-th point in a cell row, of the cell rows A, B, C and D to one another. Therefore, the cell connector $Z_{6a}$ which is situated at the sixth point in the cell row is connected to the cell connector $Z_{6b}$, which is situated at the sixth point in the cell row B, via the compensation line $L_{6a}$, and the cell connector $Z_{6b}$, which is situated at the sixth point in the cell row B, for its part is connected to the cell connector $Z_{6c}$, which is situated at the sixth point in the cell row C, of the cell row C via the compensation line $L_{6b}$. The cell connector $Z_{6c}$ is also connected to the cell connector $Z_{6d}$, which is situated at the sixth point in the cell row D, via the compensation line $L_{6c}$. Based on the schematic circuit diagram illustrated in FIG. 1, the cell connectors which are situated at an n-th point in a cell row A, B, C, D are each connected to the cell connectors, which are situated at the same n-th point, of adjacent rows via compensation lines $L_{na}$, $L_{nb}$, $L_{nc}$.

Therefore, the cell connector $Z_{7c}$ is connected to the cell connectors $Z_{7b}$ and $Z_{7d}$, which are situated at the same point, of the adjacent cell rows B and D via the compensation lines $L_{7b}$ and $L_{7c}$. Accordingly, by way of example, the cell connector $Z_{2b}$ of the cell row B is connected to the cell connectors $Z_{2a}$ and $Z_{2c}$ which are situated at the same point in the cell rows A and C via the compensation lines $L_{2a}$ and $L_{2b}$. Expressed in general terms, a cell connector ($Z_{na}$, $Z_{nb}$, $Z_{nc}$, $Z_{nd}$), which is situated at an n-th point in a cell row A, B, C or D between respective cell blocks (2, 3), is electrically connected to the cell connectors ($Z_{na}$, $Z_{nb}$, $Z_{nc}$, $Z_{nd}$), which are situated at the same n-th point of the parallel respective cell rows (A, B, C, D), via a compensation line ($L_{na}$, $L_{nb}$, $L_{nc}$).

The parallel circuit of a rechargeable battery pack 1 illustrated in FIG. 1 has outer cell rows A and D and also inner cell rows B and C. The cell connectors $Z_{nb}$ and $Z_{nc}$ of the inner cell rows B and C are each electrically connected to the cell connectors, which are situated on both sides of a cell row, of adjacent cell rows.

The currents ($I_a$, $I_b$, $I_c$, $I_d$) flowing in the cell rows (A, B, C, D) in the event of a load (discharging and charging of the cell network 5) are detected, for example, across shunt resistors across which the voltages $U_a$, $U_b$, $U_c$ and $U_d$ drop. Therefore, the respective currents $I_a$, $I_b$, $I_c$ and $I_d$ in the cell rows (A, B, C, D) can be detected by means of the voltage drop $U_a$, $U_b$, $U_c$ and $U_d$. The voltages $U_a$, $U_b$, $U_c$ and $U_d$ are supplied to an evaluation unit 10 via signal lines 140, the evaluation unit comparing the tapped-off voltages $U_a$, $U_b$, $U_c$ and $U_d$ and, therefore, the component currents $I_a$, $I_b$, $I_c$ and $I_d$ and generating a signal when there is an implausible deviation in the component currents ($I_a$, $I_b$, $I_c$, $I_d$).

Since the cell rows A, B and C are identical and are situated parallel to one another, the same current ($I_a$, $I_b$, $I_c$) has to flow in each cell row (A, B, C) at every time point. The currents ($I_a$, $I_b$, $I_c$) should therefore be approximately the same at each time point; the evaluation unit 10 therefore checks whether the voltages $U_a$, $U_b$ and $U_c$ are approximately the same at a time point $t_1$. Slight deviations in the magnitude of the voltage ($U_a$, $U_b$, $U_c$) are ignored during this plausibility comparison; there has to be a fault in one of the cell rows only when the voltages ($U_a$, $U_b$, $U_c$) deviate significantly from one another since only identical current values are plausible on account of the identical structural design of the cell rows. In this way, the comparison for plausibility can be evaluated in order to generate a signal as a function of the result of the plausibility, it being possible to use this signal as a control signal for switching off the rechargeable battery pack by means of a switch 40 and/or 43 which is driven by the evaluation unit 10 via control lines (41, 42).

An external load current $I_G$ is split into the component currents ($I_a$, $I_b$, $I_c$, $I_d$), with the current $I_d$ of the cell row D being lower than the current in the other cell rows A, B and C since the cell row D includes cell blocks 2 which have only two individual cells 4 connected in parallel. The evaluation unit 10 can therefore check whether the tapped-off voltage $U_d$ in the corresponding measurement is lower than the voltages ($U_a$, $U_b$, $U_c$) of the parallel cell rows (A, B, C). If, for example, the current $I_d$ in the cell row D increases on account of a recharging effect between the cell rows, the voltage $U_d$ increases, this being registered by the evaluation unit 10. The detected voltages $U_a$, $U_b$, $U_c$ and $U_d$ are no longer plausible with respect to one another; a signal is generated which can be used to switch off the rechargeable battery pack.

Figure 5:
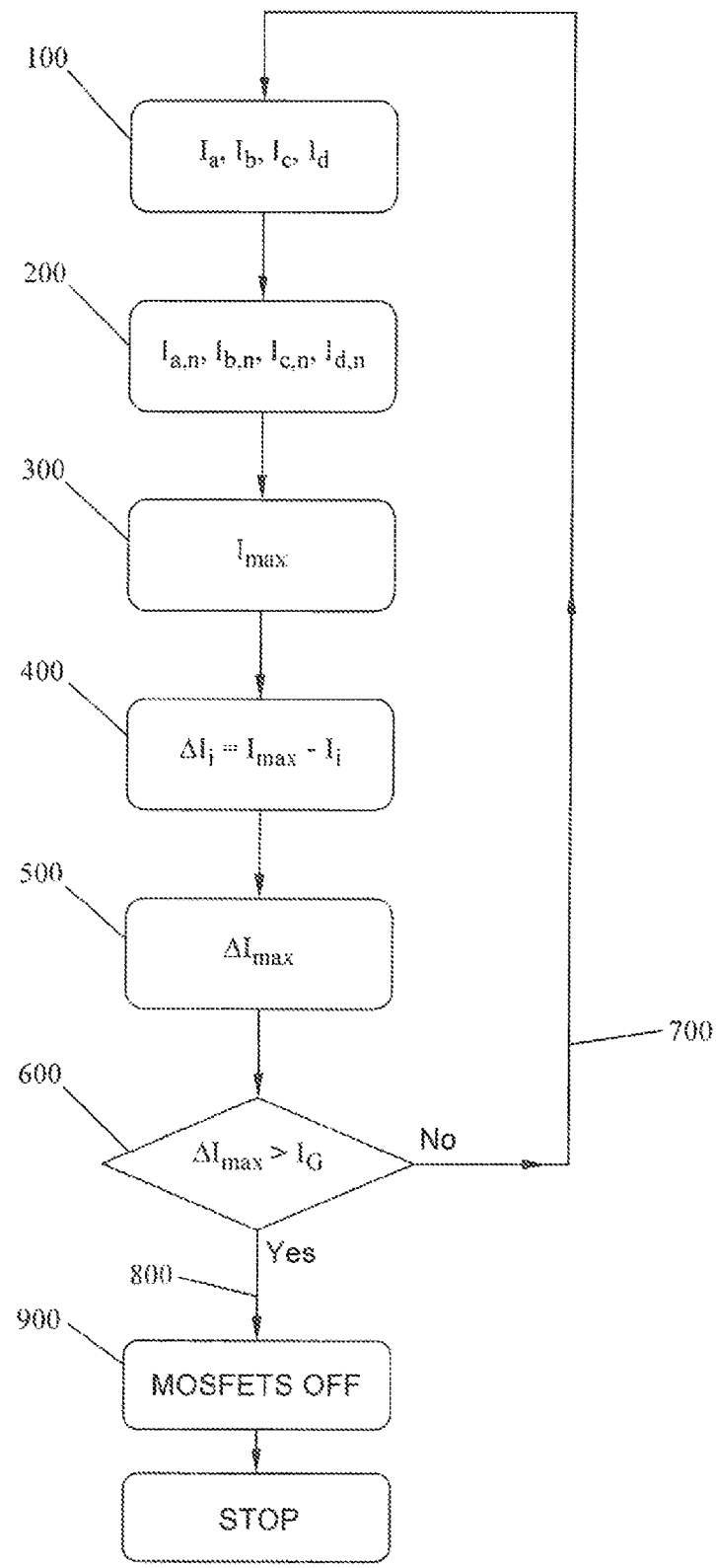

In the embodiment, the direct comparison of the detected voltages $U_a$, $U_b$, $U_c$ and $U_d$ reflects the ratio of the component currents ($I_a$, $I_b$, $I_c$, $I_d$) or of the standardized component currents ($I_{a,n}$, $I_{b,n}$, $I_{c,n}$, $I_{d,n}$) (FIG. 5) with respect to one another; however, a calculated ratio V of the component currents ($I_a$, $I_b$, $I_c$, $I_d$) or the standardized component currents ($I_{a,n}$, $I_{b,n}$, $I_{c,n}$, $I_{d,n}$) (FIG. 5) in relation to one another can also be taken into consideration. Conclusions can be directly drawn about the plausibility of the component currents ($I_a$, $I_b$, $I_c$, $I_d$) from the calculated ratio V of the component currents ($I_a$, $I_b$, $I_c$, $I_d$) or the standardized component currents ($I_{a,n}$, $I_{b,n}$, $I_{c,n}$, $I_{d,n}$) (FIG. 5). A permissible, plausible ratio V is, for example, "one", if the component currents ($I_a$, $I_b$, $I_c$) or the standardized component currents ($I_{a,n}$, $I_{b,n}$, $I_{c,n}$) (FIG. 5) are compared to one another in the cell rows of identical design. If the calculated ratio V deviates significantly from the predefined plausible ratio, the required plausibility is no longer provided and a signal is generated which can be used, for example, to switch off the rechargeable battery pack.

Calculating a ratio is also understood to mean calculating a difference signal between two component currents; a limit value which must not be exceeded is predefined for a permissible difference signal. In the case of identical cell rows, the limit value is fixed at "zero"; if the difference signal deviates significantly from the limit value, that is to say if the difference signal is greater than or lower than the limit value reflecting a ratio, the component currents are no longer plausible and a signal is generated.

A plausibility comparison is also possible in a simple manner by monitoring the mathematical sign of a component current for a change in mathematical sign; the change in mathematical sign can also be determined, for example, by calculating the ratio of the component current in one cell row at a first time point to the component current flowing in the same cell row at a second time point. If the mathematical sign of a component current changes In the same cell row, there is an implausible deviation; a signal is generated which can be used to switch off the rechargeable battery pack.

The mathematical sign of a component current in parallel cell rows can also be monitored in a simple manner by the ratio between the component currents of the cell rows flowing at the same time point in relation to one another being calculated; if the ratio is negative, the mathematical sign of a component current has changed, this being classified as implausible. A signal is generated which can be used to switch off the rechargeable battery pack.

No absolute measurement values are required for a plausibility comparison; complex algorithms and calculations for deriving information from an absolute measurement value are unnecessary. Since no absolute values are required, the detected component currents ($I_a$, $I_b$, $I_c$, $I_d$) or the voltages ($U_a$, $U_b$, $U_c$, $U_d$) which are proportional to the component currents are standardized by standardization with respect to the number of individual cells which are situated in parallel in a cell row. An implausible deviation can be determined solely from the relative magnitude of the standardized measurement values relative to other standardized measurement values.

Therefore, the measurement values which are detected in the cell row A are standardized with respect to the number of individual cells 4 which are situated in parallel in the cell row A, that is to say divided by "three"; accordingly, the measurement values which are detected in the cell row D are standardized with respect to the number of individual cells 4 which are situated in parallel in the cell row D, that is to say divided by "two".

In addition to the plausibility check of the currents ($I_a$, $I_b$, $I_c$, $I_d$) flowing in the cell rows A, b, C and D, the voltage at potential points 20 to 29 and, respectively, 30 to 39 of the parallel circuit can additionally be monitored.

The cell connectors $Z_{na}$ and $Z_{nd}$ of the external cell rows A and D form potential points 20 to 29 and, respectively, 30 to 39, with the voltage ($U_{1r}$, $U_{2r}$, $U_{3r}$, $U_{4r}$, $U_{5r}$, $U_{6r}$, $U_{7r}$, $U_{8r}$, $U_{9r}$, $U_{10r}$) ($U_{nr}$, where 1≤n≤10) or ($U_{1L}$, $U_{2L}$, $U_{3L}$, $U_{4L}$, $U_{5L}$, $U_{6L}$, $U_{7L}$, $U_{8L}$, $U_{9L}$, $U_{10L}$) ($U_{nL}$, where 1≤n≤10) between the potential points being tapped off. Therefore, the potentials of the potential points 20 to 29 on the left-hand side of the rechargeable battery pack, that is, the potential points 20 to 29 of the cell row A, are supplied to an evaluation unit 10 via signal lines 120. Accordingly, the potentials of the potential points 30 to 39 on the right-hand side of the parallel circuit, that is, the potential points 30 to 39 of the external cell row D, are supplied to the evaluation unit 10 via signal lines 130.

If the individual cells 4 of parallel cell rows (A, B, C, D) are of approximately the same thickness and in the same condition, no appreciable currents will flow via the compensation lines ($L_{na}$, $L_{nb}$, $L_{nc}$) in the case of loading as in the inoperative state. Therefore, the potential of the cell connector at the point "2" in the one cell row will be the same as the potential of the cell connector, which is situated at the same point "2", of the parallel cell row, the cell connectors being connected to one another via the compensation line. If the cells age to different degrees and, for example under loading, break down more severely than other individual cells 4 of a cell row (A, B, C, D), a compensation current will flow via a compensation line ($L_{na}$, $L_{nb}$, $L_{nc}$) in order to support the weaker individual cell.

On account of the compensation current in the compensation line ($L_{na}$, $L_{nb}$, $L_{nc}$) and the voltage which is dropped across the non-reactive resistor of the compensation line, the potentials of the cell connectors which are connected to one another will change differently. The potential difference between the two cell connectors at the same point in parallel cell rows is therefore a measure of the compensation current and therefore an indicator of a defective individual cell.

The detected voltages ($U_{nr}$, $U_{nl}$) or the detected potentials are evaluated within the evaluation unit 10; the evaluation unit is advantageously designed as a microprocessor and evaluates the respectively detected potential using a corresponding algorithm. A signal is generated depending on the result of the evaluation, the signal preferably being supplied as a control signal to a switch 40 via a control line 41, the switch being provided in the positive connection pole 16 of the rechargeable battery pack 1 in the illustrated exemplary embodiment. In addition or as an alternative, a switch 43 can also be provided in the negative connection pole 15, the switch being driven by the evaluation unit 10 via the control line 42. The off switches 40 and 43 are arranged in the housing 7 of the rechargeable battery pack 1 and serve to switch off the entire rechargeable battery pack 1 when the evaluation unit 10, on account of deviations in the detected potentials $U_{nr}$ and $U_{nl}$, generates a signal and outputs the signal via the control line 41 or 42.

The switch 40 or 43 is preferably provided as an electronic switch 44, in particular is in the form of a MOSFET.

During operation of the rechargeable battery pack, compensation currents can flow via the compensation lines ($L_{na}$, $L_{nb}$, $L_{nc}$) in order to compensate for unequal charging quantities in the individual cells 4. These compensation lines ($L_{na}$, $L_{nb}$, $L_{nc}$) are designed in such a way that they can reliably conduct the compensation currents which occur during normal operation.

The compensation lines ($L_{na}$, $L_{nb}$, $L_{nc}$) are advantageously designed in such a way that they serve as fuses between the cell rows and the cell blocks at the same time. If the compensation currents are within the permissible limits during normal operation, charge distribution between the cell blocks is performed in such a way that essentially an approximately equal charge is stored in the cell blocks. Therefore, the potentials at the potentials points 20 to 29 will each correspond to the corresponding potentials at the potential points 30 to 39. The evaluation unit 10 will therefore detect voltages $U_{nL}$ at the potential points 20 to 29 on the left-hand side of the parallel circuit, the voltages corresponding approximately to the voltages $U_{nr}$ which can be determined between the potential points 30 to 39 on the right-hand side of the parallel circuit. If, for example, the voltage $U_{4r}$ is approximately equal to the voltage $U_{4L}$, it can be assumed that the cell blocks $Z_{4a}$, $Z_{4b}$, $Z_{4c}$ and $Z_{4d}$ which are situated at the fourth point in the cell rows (A, B, C, D) are operating correctly.

If, in contrast, a defect occurs in just one individual cell 4', for example in the third cell block 3' of the cell row C, increased compensation currents will flow via the compensation lines $L_{2b}$ and, respectively, $L_{2c}$ and $L_{3b}$ and, respectively, $L_{3c}$. Since the compensation lines are advantageously in the form of fuses at the same time, the compensation line $L_{3b}$, for example, will melt in the case of an excessively high current. Therefore, an interruption 50 in the compensation line $L_{3b}$ is assumed in FIG. 3. On account of the now missing compensation current via the compensation line $L_{3b}$, the state of charge of the third cell block 3' will change more quickly than that, of the other cell, blocks (2, 3). However, the potential at the potential point 33 on the right-hand side of the parallel circuit with reference to the potential at the potential point 23 on the left-hand side of the parallel circuit changes as a result. On account of the potentials of the respective potential points 20 to 29 and, respectively, 30 to 39 which are supplied via the signal lines (120, 130), the evaluation unit 10 can identify that the voltage $U_{3r}$ which is applied between the potential points 32 and 33 deviates from the voltage $U_{3L}$ which is measured between the potential points 23 and 22 on the other side of the parallel circuit. A signal is generated on account of the deviation, the signal, as a control signal, operating the switches 40 and, respectively, 43 in the rechargeable battery pack. The rechargeable battery pack 1 is switched off. Further damage to the individual cells is avoided.

Figure 3:
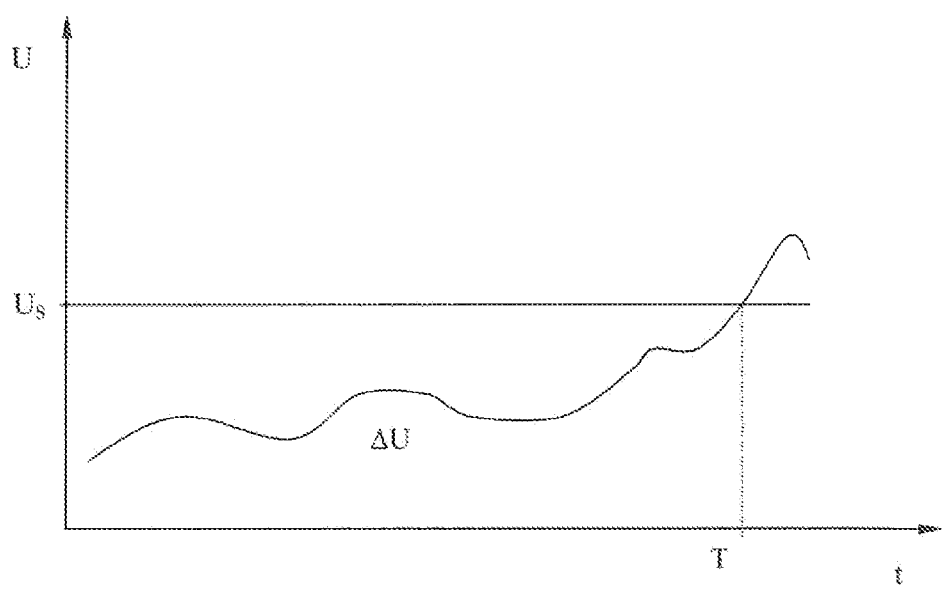
FIG. 3 shows a graph for evaluating the detected potentials.

The detected potentials $U_{nr}$ and $U_{nL}$ of the cell connectors which are situated at the same n-th point are directly compared with one another and a difference voltage $\Delta U$ is calculated in a simple manner, the difference voltage being permanently compared with a threshold value $U_S$ (FIG. 3). If the difference voltage $\Delta U$ exceeds the threshold value $U_S$ at time point T, a signal is generated which leads, for example, to the rechargeable battery pack being switched off. The fluctuations in the difference voltage $\Delta U$ illustrated in FIG. 3 are attributable to compensation currents in the compensation lines which flow during operation; the difference voltage $\Delta U$ increases to beyond the threshold value $U_S$ and leads to the rechargeable battery pack 1 being switched off only when the compensation currents become excessively high or a compensation line is interrupted in accordance with its characteristic as a fuse.

Figure 4:
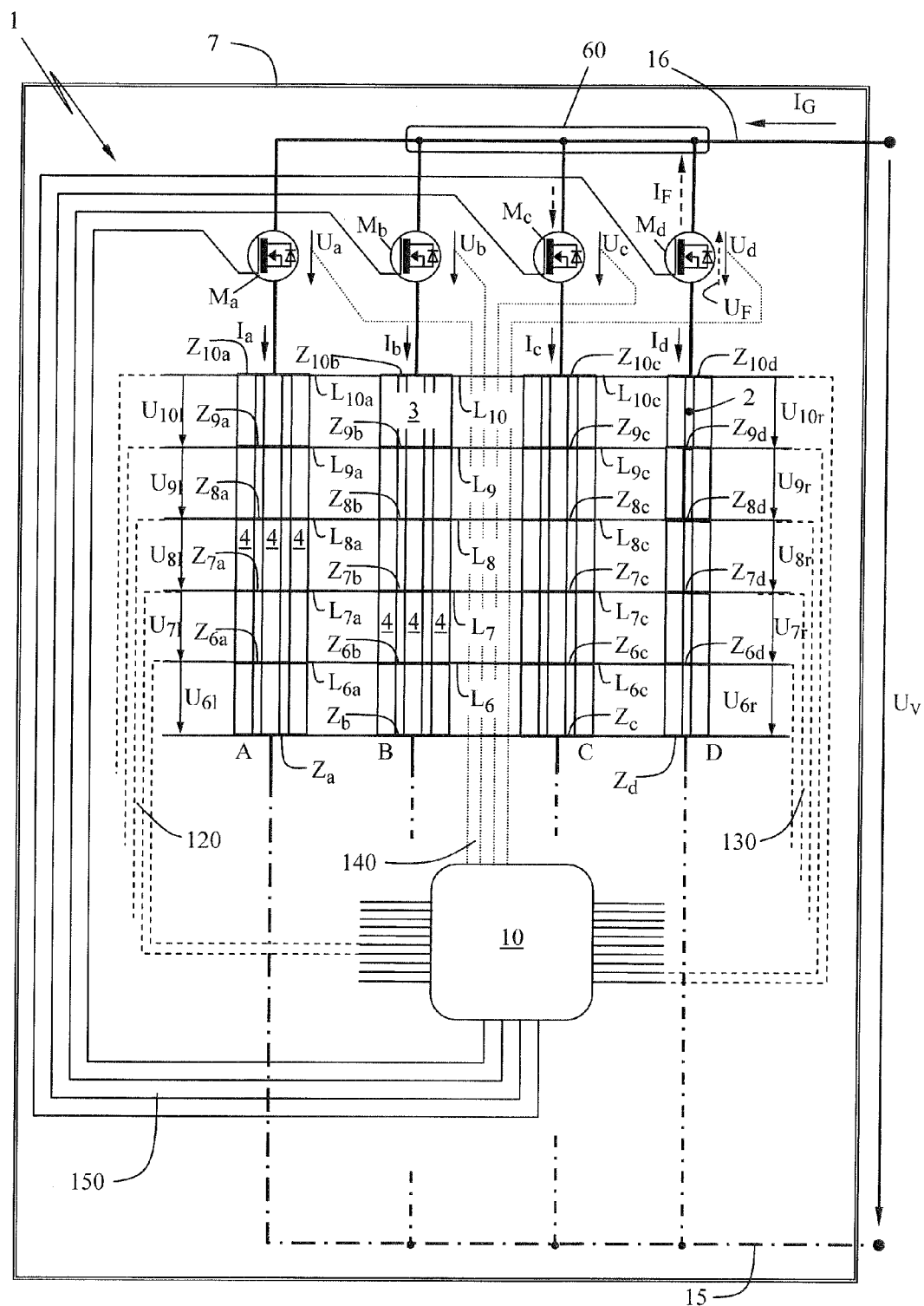
FIG. 4 shows a schematic of a partial electrical equivalent circuit diagram of a rechargeable battery pack with plausibility checking of the flowing currents; and, FIG. 5 shows a flowchart for a plausibility check.

As a further, independent invention, provision can be made for the parallel cell rows A, B, C and D of the individual cells 4 to form an imaginary matrix from ten rows (in general m rows) of individual cells and four columns (in general n columns) of cell rows A, B, C and D. The cell block (2, 3) including individual cells 4 which contain a defect can be established firstly by monitoring the voltage at the potential points 30 to 39 and 20 to 29 and checking the plausibility of the cell currents ($I_a$, $I_b$, $I_c$, $I_d$) flowing in the cell rows A, B, C and D. The row containing the defect can be determined by comparing the potentials of the cell connectors ($Z_{na}$, $Z_{nd}$), and the column (A, B, C, D) containing the defect can be determined by checking the plausibility of the component currents $I_a$, $I_b$, $I_c$ and $I_d$. If, as illustrated in FIG. 4, a switch is provided in each cell row (A, B, C, D), the switch being in the form of an electronic switch ($M_a$, $M_b$, $M_c$, $M_d$), in particular a MOSFET, in the exemplary embodiment according to FIG. 4, the defective cell row (A, B, C, D) which is established in accordance with the matrix principle can accordingly be disconnected by the corresponding switches ($M_a$, $M_b$, $M_c$, $M_d$). Expediently, however, the entire rechargeable battery pack is switched off by the switches 40 and, respectively, 43 which are arranged in the housing of the rechargeable battery pack 1. Provision may also be made, when a defect occurs, to switch off all the electronic switches ($M_a$, $M_b$, $M_c$, $M_d$) which are situated in the cell rows at the same time, instead of the switches 40 and 43 which are situated in the connection poles.

As indicated in FIG. 4, the currents ($I_a$, $I_b$, $I_c$, $I_d$) flowing in the cell rows A, B, C and D can also be compared with a total current $I_G$ which is detected at the connection pole 15 or 16 of the rechargeable battery pack 1. In this case, the magnitudes of the currents ($I_a$, $I_b$, $I_c$, $I_d$) flowing in the components to or from the nodes 60 are firstly added up and secondly compared with the current $I_G$, which can also be stated as a value, flowing in the connection pole 16 to the node 60. Advantageously:

$$|I_G|=|I_a|+|I_b|+|I_c|+|I_d|.$$

Plausibility is only established when the calculated sum current $|I_a|+|I_b|+|I_c|+|I_d|$ corresponds to the total current $I_G$ or $|I_G|$. If the total, current is "zero" and a sum current is nevertheless determined, the result is implausible; a corresponding signal is generated. It is therefore possible to establish whether the rechargeable battery pack is still in working order at any time via the plausibility check, for example in the evaluation unit 10.

If compensation currents are produced on account of a defect in a cell row, for example in the cell row C, a fault current $I_F$ can flow into the cell row C, for example from cell row D; therefore the sum current of the individual magnitudes of the currents $|I_a|+|I_b|+|I_c|+|I_d|$ relative to the magnitude of the total current $I_G$ changes, this being identified as a defect by the plausibility check.

In a simple manner, the component currents ($I_a$, $I_b$, $I_c$, $I_d$) in the cell rows (A, B, C, D) can be detected by means of the voltage ($U_a$, $U_b$, $U_c$, $U_d$) which is dropped across the electronic switches ($M_a$, $M_b$, $M_c$, $M_d$), and therefore shunt resistors are not required. The voltage ($U_a$, $U_b$, $U_c$, $U_d$) which is dropped across the electronic switch is a proportional variable to a flowing component current ($I_a$, $I_b$, $I_c$, $I_d$). If there is a significant defect, the voltage which is dropped across a switch ($M_a$, $M_b$, $M_c$, $M_d$) can, for example, reverse, as is illustrated by way of a dashed line in FIG. 4 using the example of the cell row D by the voltage $U_F$.

In the exemplary embodiment, the individual cells 4 are based chemically on lithium; the individual cells 4 are advantageously Li-ion cells, Li-polymer cells, LiFE cells or similar cells. The individual cells 4 can also have a different chemical structure, for example NiCd, NiMH or the like.

In a further exemplary embodiment of the plausibility check, a maximum component current $I_{max}$ is established in accordance with the flowchart in FIG. 5, which is continuously run through, from all the detected component currents ($I_a$, $I_b$, $I_c$, $I_d$), in particular the standardized component currents ($I_{a,n}$, $I_{b,n}$, $I_{c,n}$, $I_{d,n}$), and used for a further evaluation. In the flowchart, 100 designates the step of detecting the component currents ($I_a$, $I_b$, $I_c$, $I_d$) at a time point $t_1$, and 200 designates the step of standardizing with respect to the number n of individual cells 4 which are connected in parallel in a cell row in a cell block. In step 300, a maximum component current $I_{max}$ is selected from the standardized component currents ($I_{a,n}$, $I_{b,n}$, $I_{c,n}$, $I_{d,n}$) and, in the following step 400, a difference current $\Delta I_i$ between the maximum component current $I_{max}$ and each of the other component currents $I_i$ is determined in each case. Therefore, if the standardized component current $I_{c,n}$ is established as a maximum component current $I_{max}$ ($I_{max}=I_{c,n}$), the respective difference current $\Delta I_i$ is determined as follows:

$$\Delta I_1 = I_{max} - I_1 \text{ (where } I_1 = I_{a,n})$$

$$\Delta I_2 = I_{max} - I_2 \text{ (where } I_2 = I_{b,n})$$

$$\Delta I_3 = I_{max} - I_3 \text{ (where } I_3 = I_{c,n})$$

In step 500, the maximum difference current $\Delta I_{max}$ is selected from the determined difference currents ($\Delta I_1$, $\Delta I_2$, $\Delta I_3$) and, in the following step of the decision diamond 600, is compared with a predefined, permissible limit value $I_G$. If the difference current $\Delta I_{max}$ is below the permissible limit value $I_G$, the process returns to step 100 via the branch 700 of the decision diamond 600, in order to once again detect the component currents at a following time point $t_2$ and to re-evaluate the component currents in the following steps.

If the difference current $\Delta I_{max}$ is above the permissible limit value $I_G$, the process moves via the branch 800 of the decision diamond 600 to the next step 900 in which a signal is generated which can be used to drive the electronic switches, in particular the MOSFETs, in order to, for example, switch off the rechargeable battery pack. The flowchart runs to "STOP".

It is understood that the foregoing description is that of the preferred embodiments of the invention and that various changes and modifications may be made thereto without departing from the spirit and scope of the invention as defined in the appended claims.

What is claimed is:

1. A protective circuit for an arrangement having a plurality of individual cells in a rechargeable battery pack, wherein a predetermined number of individual cells are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack, said protective circuit comprising:
    a circuit device configured to compare the first component current with the second component current to determine whether an implausible deviation is present therebetween and generate a signal when an implausible deviation is present;
    each of said cell rows having a plurality of cell blocks arranged in series;
    each of said cell blocks having at least two individual cells arranged in parallel; and,
    said circuit device being configured to standardize said first and second component currents detected with the number of individual cells arranged in parallel in the corresponding one of said cell rows.

2. The protective circuit of claim 1, wherein:
    said circuit device is configured to calculate a difference between the first and the second component currents and generate said signal when said difference exceeds a pre-given value ($I_G$).

3. The protective circuit of claim 1, wherein said circuit device is configured to standardize said first component current and said second component current before comparing said currents; and, said circuit device is configured so as to cause said signal to be generated when said difference exceeds a predetermined value ($I_G$).

4. The protective circuit of claim 1, wherein said implausible deviation is derived from the ratio (v) of said first and said second component currents to each other.

5. The protective circuit of claim 1, wherein said implausible deviation is derived from a change of the mathematical sign of said component currents.

6. The protective circuit of claim 1, wherein:
    said battery pack is configured to output a total current ($I_G$); and,
    said circuit device is configured to derive said implausible deviation by comparing a sum of the magnitudes of said component currents to said total current ($I_G$).

7. The protective circuit of claim 1, wherein:
    said battery pack has more than two parallel cell rows; and,
    said circuit device is configured to compare said component currents of each of said cell rows to each other.

8. A protective circuit for an arrangement having a plurality of individual cells in a rechargeable battery pack, wherein a predetermined number of individual cells are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack, said protective circuit comprising:
    a circuit device configured to compare the first component current with the second component current to determine whether an implausible deviation is present therebetween and generate a signal when an implausible deviation is present;
    said circuit device being configured to determine a maximum component current ($I_{max}$) from said component currents detected; and,
    said circuit device being also configured to determine a difference current ($\Delta I_i$) between said maximum component current ($I_{max}$) and said component currents detected and compare at least one difference current ($\Delta I_i$) with a limit value ($I_G$).

9. A protective circuit for an arrangement having a plurality of individual cells in a rechargeable battery pack, wherein a predetermined number of individual cells are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack, said protective circuit comprising:
    a circuit device configured to compare the first component current with the second component current to determine whether an implausible deviation is present therebetween and generate a signal when an implausible deviation is present;
    an evaluation unit; and, wherein:
    said circuit device is configured to output measurement values of said first and said second component currents to said evaluation unit; and,
    said evaluation unit is configured to conduct a plausability test and to determine whether an implausible deviation is present and to output an output signal when an implausible deviation is present.

10. The protective circuit of claim 9, wherein each of said cell rows has an associated switch configured to be controlled by said evaluation unit.

11. The protective circuit of claim 10, wherein:
    said circuit device is configured to detect the voltage drops at said switches and output the detected voltage drops to said evaluation unit; and,
    said evaluation unit is configured to evaluate the voltage drop at said switches as a proportional variable to said component currents.

12. The protective circuit of claim 11, wherein said switches are electronic switches.

13. The protective circuit of claim 11, wherein said switches are MOSFETs.

14. A protective circuit for an arrangement having a plurality of individual cells in a rechargeable battery pack, wherein a predetermined number of individual cells are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack, said protective circuit comprising:
    a circuit device configured to compare the first component current with the second component current to determine whether an implausible deviation is present therebetween and generate a signal when an implausible deviation is present;
an evaluation unit;
said individual cells of each of said cell rows have respective cell connectors arranged between each other;
each of said cell connectors of one cell row having a position therein which corresponds to the position of a corresponding one of the cell connectors in each of the other cell rows;
a plurality of compensation lines electrically interconnecting corresponding ones of the cell connectors of the different rows;
each of said cell connectors being at a potential ($U_{nl}$, $U_{nr}$); and,
said circuit device being configured to detect said potential ($U_{nl}$) at at least one of said cell connectors of said first cell row and said potential ($U_{nr}$) at the corresponding one of said cell connectors of said second row and output said potentials ($U_{nl}$, $U_{nr}$) to said evaluation unit.

15. The protective circuit of claim 14, wherein said evaluation unit is configured to evaluate said potentials ($U_{nl}$, $U_{nr}$) with respect to each other and output a signal in dependence on the result of said evaluation.

16. The protective circuit of claim 15, wherein said evaluation unit is configured to compare said potentials ($U_{nl}$, $U_{nr}$) directly to each other.

17. The protective circuit of claim 14, wherein said evaluation unit is configured to derive a difference voltage ($\Delta U$) from said potential ($U_{nl}$) at said one of said cell connectors of said first cell row and said potential ($U_{nr}$) at said corresponding one of said cell connectors of said second cell row and to compare said differential voltage ($\Delta U$) to a predetermined limit value and to output a signal when said differential voltage ($\Delta U$) exceeds said limit value.

18. The protective circuit of claim 15, wherein:
said battery pack has a housing;
said cell rows are arranged in said housing;
said evaluation unit is disposed in said housing; and,
said circuit device is configured to transmit said potential ($U_{nl}$) detected at at least one of said cell connectors of said first cell row and said potential ($U_{nr}$) at the corresponding one of said cell connectors of said second row to said evaluation unit.

19. The protective circuit of claim 14, wherein:
said battery pack has a plurality of cell rows arranged in parallel;
each one of said cell rows has a multiplicity of individual cells connected in series via the cell connectors corresponding to said one row;
each of said individual cells and cell connectors of one of said cell rows has corresponding ones of individual cells and cell connectors in each of said other cell rows; and,
each one of said compensation lines interconnects corresponding ones of said cell connectors at like locations in corresponding ones of said cell rows.

20. The protective circuit of claim 19, wherein:
said cell rows include said first cell row and a last cell row connected in parallel with said first cell row;
the cell connectors of said first cell row each have a potential ($U_{nl}$);
said cell connectors of said last cell row each have a potential ($U_{nr}$);
said circuit device is configured to detect said potentials ($U_{nl}$) at said cell connectors of said first cell row and said potentials ($U_{nr}$) at said cell connectors of said second cell row and output said potentials to said evaluation unit; and,
said evaluation unit is configured to evaluate said potentials ($U_{nl}$, $U_{nr}$).

21. The protective circuit of claim 14, wherein:
said parallel cell rows of said individual cells are configured to form an imaginary matrix having m-rows of individual cells and n-columns of cell rows;
said circuit device is configured to determine a defect by row (m) by comparing said potentials of said cell connectors and to determine a defect by column (n) as a result of the implausible deviation determination.

22. The protective circuit of claim 21, wherein:
each of said cell rows has an associated switch configured to be controlled by said evaluation unit; and,
said switches are configured to turn off said cell row in which a defect has been determined.

23. The protective circuit of claim 22, wherein:
each of said cell rows has an associated switch configured to be controlled by said evaluation unit;
said signal is a control signal; and,
said switches are configured to disconnect at least one of said cell rows or said rechargeable battery pack on the basis of said control signal.

24. A protective circuit for an arrangement having a plurality of individual cells in a rechargeable battery pack, wherein a predetermined number of individual cells are connected in series so as to form a cell row and at least a first and a second cell row are arranged in parallel; the first cell row is configured to have a first component current flow therein when a load is applied to the battery pack and the second cell row is configured to have a second component current flow therein when a load is applied to the battery pack, said protective circuit comprising:
a circuit device configured to compare the first component current with the second component current;
first and second switches arranged in corresponding ones of said first and second cell rows with first and second voltage drops being present across corresponding ones of said first and second switches; and,
an evaluation unit configured to control said first and second switches and to detect and evaluate said voltage drops as respective quantities proportional to corresponding ones of said first and second component current flows and generating a signal when there is an implausible deviation of said first and second component current flows from each other.

* * * * *

UNITED STATES PATENT AND TRADEMARK OFFICE
CERTIFICATE OF CORRECTION

| | |
|---|---|
| PATENT NO. | : 9,267,998 B2 |
| APPLICATION NO. | : 13/726366 |
| DATED | : February 23, 2016 |
| INVENTOR(S) | : Gaul et al. |

Page 1 of 1

It is certified that error appears in the above-identified patent and that said Letters Patent is hereby corrected as shown below:

In the specification,

In column 1:
Line 48: delete "ceils" and substitute -- cells -- therefor.
Line 49: delete "ceils" and substitute -- cells -- therefor.
Line 58: delete "currant" and substitute -- current -- therefor.

In column 2:
Line 63: delete "ail" and substitute -- all -- therefor.

In column 3:
Line 26: delete "ceils" and substitute -- cells -- therefor.
Line 28: delete "ceils" and substitute -- cells -- therefor.

In column 4:
Line 12: delete "ceils" and substitute -- cells -- therefor.
Line 50: delete "call" and substitute -- cell -- therefor.

In column 6:
Line 31: delete "-whether" and substitute -- whether -- therefor.

In column 13:
Line 37: delete "15" and substitute -- 14 -- therefor.

Signed and Sealed this
Seventh Day of June, 2016

Michelle K. Lee
*Director of the United States Patent and Trademark Office*